US006016276A

United States Patent [19]
Fuji

[11] Patent Number: 6,016,276
[45] Date of Patent: Jan. 18, 2000

[54] SEMICONDUCTOR MEMORY DEVICE WHICH CAN BE SET ONE FROM MULTIPLE THRESHOLD VALUE

[75] Inventor: Yukio Fuji, Kanagawa, Japan

[73] Assignee: NEC Corporation, Tokyo, Japan

[21] Appl. No.: 09/099,404

[22] Filed: Jun. 18, 1998

[30] Foreign Application Priority Data

Jun. 20, 1997 [JP] Japan ................................. 9-163912

[51] Int. Cl.[7] ................................................. G11C 16/04
[52] U.S. Cl. ........................ 365/189.07; 365/189.09; 365/189.11; 365/210
[58] Field of Search ..................... 365/189.07, 189.09, 365/189.11, 210

[56] References Cited

U.S. PATENT DOCUMENTS

| 4,648,074 | 3/1987 | Pollachek | 365/210 |
| 5,058,063 | 10/1991 | Wada et al. | 365/189.11 |
| 5,202,855 | 4/1993 | Morton | 365/189.11 |
| 5,297,095 | 3/1994 | Sato et al. | 365/189.11 |
| 5,351,212 | 9/1994 | Hashimoto | 365/189.09 |
| 5,602,774 | 2/1997 | Elrabaa et al. | 365/189.11 |
| 5,828,616 | 10/1998 | Bauer et al. | 365/210 |

FOREIGN PATENT DOCUMENTS 62-140298   6/1987   Japan .

Primary Examiner—Trong Phan
Attorney, Agent, or Firm—Sughrue, Mion, Zinn, Macpeak & Seas, PLLC

[57] ABSTRACT

The semiconductor device of the present invention comprises a memory cell in which one threshold value is set out of n kinds of threshold values. The device includes, a word line for selecting the memory cell, an X decoder for selecting the word line, a sense amplifier for amplifying an output of the memory cell, n−1 reference cells in which n−1 kinds of threshold values are set, n−1 reference amplifier for amplifying an output of each of the reference cells, and an n−1 differential amplifier for receiving the output of each of the reference amplifier and the output of the sense amplifier. Further, the device includes an encoder for encoding the output of the n−1 differential amplifier. Finally, the semiconductor device of the present invention comprises a level shift circuit for supplying all the reference amplifier with a voltage which is half the voltage of adjacent threshold values lower than the voltage supplied to the word line.

32 Claims, 6 Drawing Sheets

SEMICONDUCTOR MEMORY DEVICE WHICH CAN BE SET ONE FROM MULTIPLE THRESHOLD VALUE

BACKGROUND OF THE INVENTION

1. Field of the Invention

The present invention relates to a multiple value type semiconductor memory device, and more particularly to reading system of the multiple value type non-volatile memory device.

2. The Related Art

FIG. 6 is a structural view of a conventional three-stage reading method circuit. FIG. 7 is a data read timing view of the circuit shown by FIG. 6.

Suppose that Vt1 is set to a memory cell C1 (206) out of four threshold values Vti (i=b 1, 2, 3 or 4, Vt0<Vt1<Vt2<Vt3). However, here the threshold value Vti reference to a voltage between a source and a gate in which a drain current of the cell exceeds a leak current level in the off state. The threshold value of the reference cell Rc2 (208) is set to Vt1 and the threshold value of the reference cell Rc3 (209) is set to Vt2 respectively.

An output level of a regulated voltage circuit 1 (218) is the same voltage as the threshold value Vt0. An output level of a regulated voltage circuit 2 (219) is set to the threshold value Vt1. An output level of the regulated voltage circuit 3 (220) is set to the same voltage as the threshold value Vt2. Consequently, in the case where the output level Vt0 of the regulated voltage circuit 1 (218) is given to the gate of the memory cell, the threshold value which is set in the memory cell is other than Vt0 (Vt1, Vt2 or Vt3), the memory cell is set to an OFF state. In the case where the output level Vt1 of the regulated voltage circuit 2 (219) is given to the gate of the memory cell, the memory cell, the threshold value which is set in the memory cell is Vt2 or Vt3, is set to the OFF state. In the case where the output level Vt2 of the regulated voltage circuit 3 (220) is given to the gate of the memory cell, the memory cell, the threshold value which is set in the memory cell is Vt3, is set to the OFF state. First stage word line level which is an output of regulated voltage circuit 1 is given to the transistor RC1. A second stage word line level which is an output from the regulated voltage circuit 2 is given to the gate of the transistor RC2. A third stage word line level which is an output from the regulated voltage circuit 3 is given to the gate of the transistor RC3. Each drains of reference cells 1 through 3 are connected to the reference amplifier 1 (203), a reference amplifier 2 (204) and a reference amplifier 3 (205), respectively.

Next, the operation of the conventional three stage reading current is explained.

A pulse generating circuit 217 generates a pulse signal (231),/P1 (232), a P2 (235),/P3 (236),(Here, symbol"/" denotes a negative logic).

In the beginning, in the case where all the pulse signal P1 (231), a P2 (233), a P3 (235) are set to H level, this circuit is in an inactive state.

Next, when the word line selection signal XP (230) and a pulse signal P1 (231) become a L level (Tac 1 period). Since a transfer gate 240 and a transfer gate 243 is turned on to be set in a conductive state, and transfer gate 246 is also turned on to be set in a conductive state with XP signal 230, an output level Vt0 of the regulated voltage circuit 1 is supplied through a word line W00 (250) (first stage word level) to the gate of the memory cell C1. Therefore, the memory cell C1 is being selected.

Here, since the threshold voltage Vt1 is set in the memory cell C1 (206), the memory cell C1 (206) is set in the OFF state. On the other hand, the threshold value of a reference cell RC1 (207) is set to Vt0, so that the reference cell RC1 (207) is set in the ON state. With a comparison of the threshold value with the reference voltage, it is made clear that the data at a timing Tac1 is OFF (High, for example, logic value 1).

Next, a pulse signal P1 (231) is risen, and P2 (233) is fallen so that the transfer gate 240 and the transfer gate 243 are set in a non-conductive state, the transfer gate 241 and the transfer gate 244 are set in the conductive state at Tac2 period.

At this time, the output level Vt1 of the regulated voltage circuit 2 is supplied through the word line W00 (233) (second stage word level) to the memory cell C1, the memory cell C1 (206) is set to the ON state, and the reference cell RC2 (208) is also set in the ON state, and it is judged that the data at a timing Tac2 is set to the ON state (Low, for example, logic value 0).

Next, the pulse signal P2 (233) is risen, and the pulse signal P3 (235) is fallen so that the transfer 241 and the transfer gate 244 are set in the non-conductive state while the transfer gate 242 and the transfer gate 245 are set to a conductive state at Tac2 and Tac3, respectively.

At time period Tac 3, an output level Vt2 of the regulated voltage circuit 3 is supplied through the word line W00 (250) (third stage level) to the memory cell C1 so that the memory cell C1 (206) is set in the ON state. The reference cell RC3 (209) is also set in the ON state. In the case of the same gate level, it is judged that the data at Tac3 is ON (Low, for example, logic value 0).

Relation between the output of the (differential) sense amplifier 202 at time Tac1, Tac2, Tac3 and an output D0 and D1 of the output circuit 214 with respect to each threshold values is as shown in Table 1.

TABLE 1

|     | Tac 1 | Tac 2 | Tac 3 | D1 | D0 |
| --- | --- | --- | --- | --- | --- |
| Vt0 | 0 | 0 | 0 | 0 | 0 |
| Vt1 | 1 | 0 | 0 | 0 | 1 |
| Vt2 | 1 | 1 | 0 | 1 | 0 |
| Vt3 | 1 | 1 | 1 | 1 | 1 |

This methods has advantage in that ON and OFF of the transistor can be judged with the word line level and difference with the threshold voltage Vt written on the cell so that a secured reading can be carried out. However, there is a problem in that the access speed is slow. That is, in the case where a parasitic capacitance C and resistor R attached on the word line supplying signal X, time required for accumulate attainment of desired level V1 is represented approximately by the product of C and R. Consequently, speed in the case of reading the aforementioned word line in three stages can be represented by the following equation when the reading completion time from the determination of the level of the word line at the sense amplifier is set to Ts.

$$Tac = 3 \times C \times R + 3 \times Ts.$$

In other words, in order to read and exchange the cell written in the 2 Bit data, time for reading the data will be three times as long as time for reading a normal 1 Bit. Consequently, market demand for a high speed devices is not satisfied, and only semiconductor memory devices of a special reading method such as serial access method or the like can be supplied to the market.

Special circuits such as a regulated voltage circuit for generating desired voltage level, a pulse generating circuit and a delay circuit for controlling a word line rise time are needed such that these special circuits occupy about 20% of the chip area.

Furthermore, in the case of the binary search style, as compared with the reading method shown in FIGS. 6 and 7, a second stage word level is generated in the Tac period in the beginning to supply to the memory cell so that it is judged whether the memory cell is turned on or off. When the memory cell is turned on, the word line level is set to the first stage word level lower than the second stage word level in the following Tac 2 period. When the memory cell is turned off, the word line level is set to the third stage word level higher than the second stage word level. As a result, the 2 Bit data is outputed by judging whether the memory cell is turned on and off during the Tac 2 period. However, the method cannot be used in the case where a plurality of selected memory cells are connected to one word line. That is, when one word line is connected to one memory cell having the threshold voltage Vt1 and an other memory cell having the threshold voltage Vt2, the aforementioned memory cell is turned on in Tac 1 period. Then, in the following Tac 2 period, the word line level must be set to the first stage word level to detect the threshold voltage of the aforementioned memory cell. However, since the latter memory cell is turned off in the Tac 1 period, the word line level must be set to the third stage word level in the Tac 2 period. Therefore, since this reading manner requires one word line corresponding to one memory cell to read out the data stored in the memory cells during Tac 1 and 2 period, a problem of chip size increased occurs.

On the other hand, with respect to the multiple value cell type semiconductor memory device, another method for reading data of the cell is by raising the word line at one-time as disclosed, for example, by the Japanese Laid-Open Patent application No. SHO 62-140298.

FIG. 8 shows a circuit for a semiconductor memory device described in the SHO 62-140298. In this example, this circuit comprises a reference amplifier RA10 for generating three reference voltage signals (here, this figure only shows a reference amplifier RA10 consisting of transistors S1 and S2 for the generating one reference voltage signal) and a sense amplifier SA10 consisting of transistors Q1, Q11, and Q12. A memory transistor M1 can be set to one of four different $I_{on}$ current levels (I1<I2<I3<I4). On the other hand, reference currents (I1+I2, I2+I3, I3+I4) are formed with a combination of transistors S1, S2, S2+S3, S3+S4 from the transistors S1, S2, S3, and S4 having the respective $I_{on}$ current levels I1, I2, I3, and I4. Furthermore, the load MOS transistors Q11 and Q12 having the same size as the load MOS transistor Q1 of the sense amplifier, constitutes a current mirror pair. When the current which flows through the memory cell M1 is temporarily I2, the current which flows through the transistor Q1 becomes I2 so that the current which flows through the transistors Q11 and Q12 becomes 2×I2 in total. However, with the current which flows through the load MOS transistors Q11 and Q12 the relationship of 2×I2>I1+I2, 2×I2<I2+I3, 2×I2<I3+I4 is established with the result that the output level becomes H only in the case of 2×I2>I1+I2. In other cases, the current can be detected all as low.

In the aforementioned embodiment, when the memory cell transistor M1 may be alternative currents I1 or I2, the reference current I1+I2 is generated as the reference current to compare with the current flowing in the cell transistor M1.

In this case, when this embodiment is compared with the previous embodiment, there is an advantage in that it becomes possible to read the data written in the memory cell and to carry out a high speed operation. However, a cell current $I_{on}$ in the memory cell area has a large variation so that the reading operation becomes inaccurate. Further, two reference cells are required with respect to one reference amplifier as a reference cell so that the area of the chip occupied by the reference cell becomes large. That is, it is difficult in the process to control the variation of current $I_{on}$ with a slight difference in a slight threshold value to write data on the memory cell, and data writing becomes unreliable with respect to the cell $I_{on}$ variation. Further, the reference cell area will increase. Moreover, two references are required to produce one comparison value so that a distribution of errors is doubled so as to produce and unreliable readings as a result of variation of the cell current $I_{on}$.

SUMMARY OF THE INVENTION

The present invention is to provide a multiple value type semiconductor device which can secure a high speed and stable reliable operation with reduced chip area.

A semiconductor memory device of the present invention comprises: a memory cell in which one threshold value is set out of n (n is an arbitrary integer of 2 or more) kinds of threshold values; a word line connected to a gate of the memory cell; an X decoder for controlling the word line; a sense amplifier for amplifying an output from the memory cell; n−1 reference cells in which n−1 kind of reference values are respectively set; n−1 reference amplifiers for amplifying an output of the respective reference cell; n−1 differential amplifiers for inputing the output of the respective reference amplifiers and the output of the sense amplifier; an encoder for encoding an output of the n−1 differential amplifier; and a voltage dividing circuit for supplying to the gate of the n−1 reference cells a voltage lower than the voltage supplied with the word line by half of the difference between the adjacent two threshold values.

BRIEF DESCRIPTION OF THE DRAWINGS

The above and other objectives, advantages and features of the present invention will be apparent from the following description taken in conjunction with the accompanying drawings, in which.

DETAILED DESCRIPTION OF THE PREFERRED EMBODIMENTS

Figure 1:
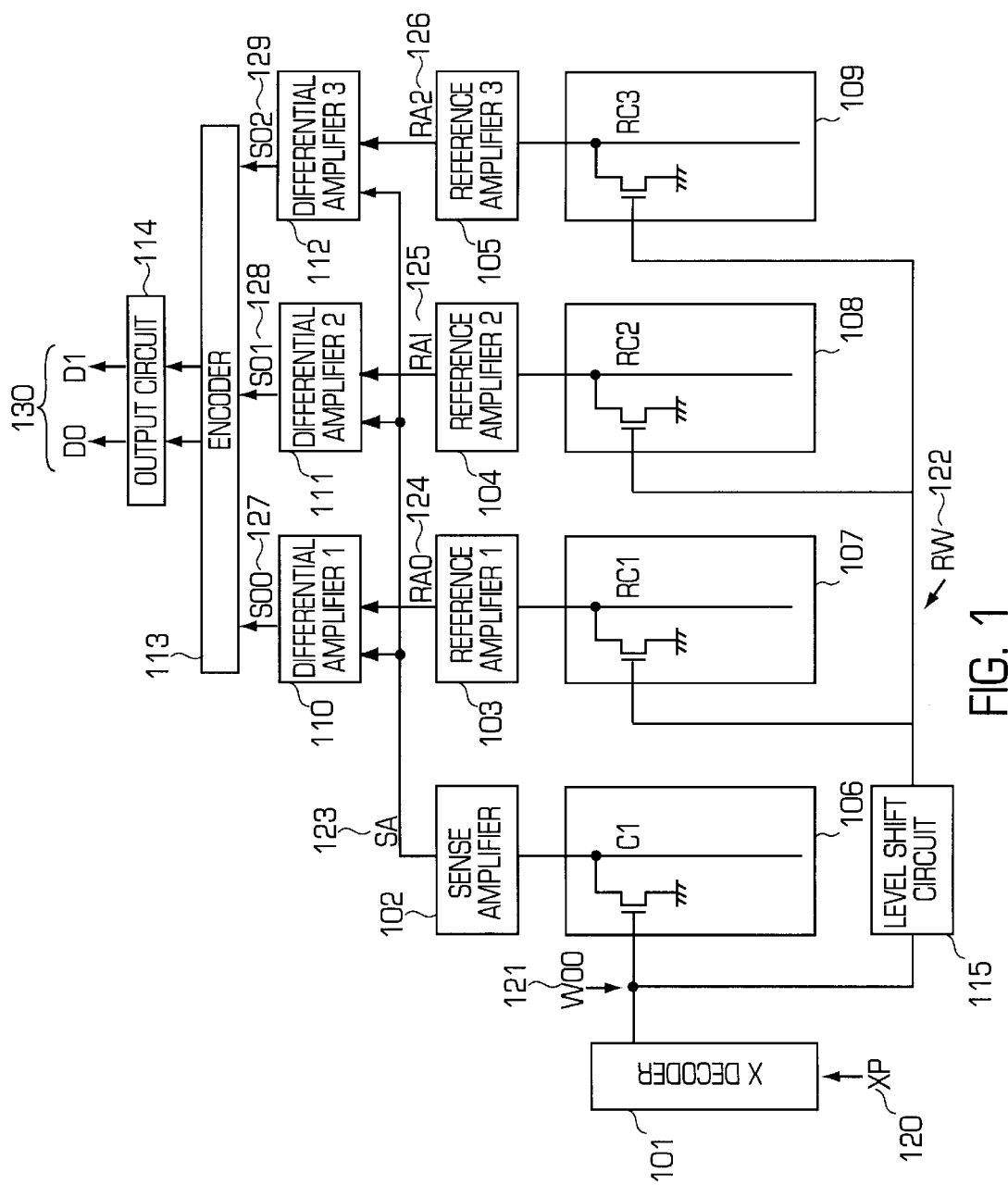
FIG. 1 is a block diagram of a multiple value type semiconductor memory device according to an embodiment of the present invention.

FIGS. 1 through 5 show embodiments of the present invention. Referring to FIG. 1, the semiconductor device according to a first embodiment of the present invention comprises a memory cell C1 (106) and an X decoder 101 for selecting the memory cell 106 through a word line W00 121. A sense amplifier 102 is connected to the transistor drain of cell 106 to amplify data memorized in the cell 106. A level shift circuit 115 receives an output of the X decoder 101 and outputs a regulated level to reference cells RC1 through RC3 (107, 108 and 109) through a line RW 122. The reference cells RC1 through RC3 (107 to 109) are set at respective different threshold values. Reference amplifiers 1 through 3 (103 to 105) amplifies data written in the reference cells RC1 through RC3 (107 to 109) to output the respective reference voltages to the lines RA0 through RA2 (124 to 126). Differential amplifiers 1 through 3 (110 to 112) receives the respective output from the reference amplifiers 1 through 3 (103 to 105) and an output of a sense amplifier 102 to judge levels the received signals respectively and output the result on the respective lines S00, S01 and S02 (127 to 129). An encoder 113 inputs the voltage output of the differential amplifiers 1 through 3 (110 to 112) and encodes the information output two bit data D0 and D1. An output circuit 114 amplifies the encoded output and outputs the two data bits D0 and D1 to the outside.

Figure 2:
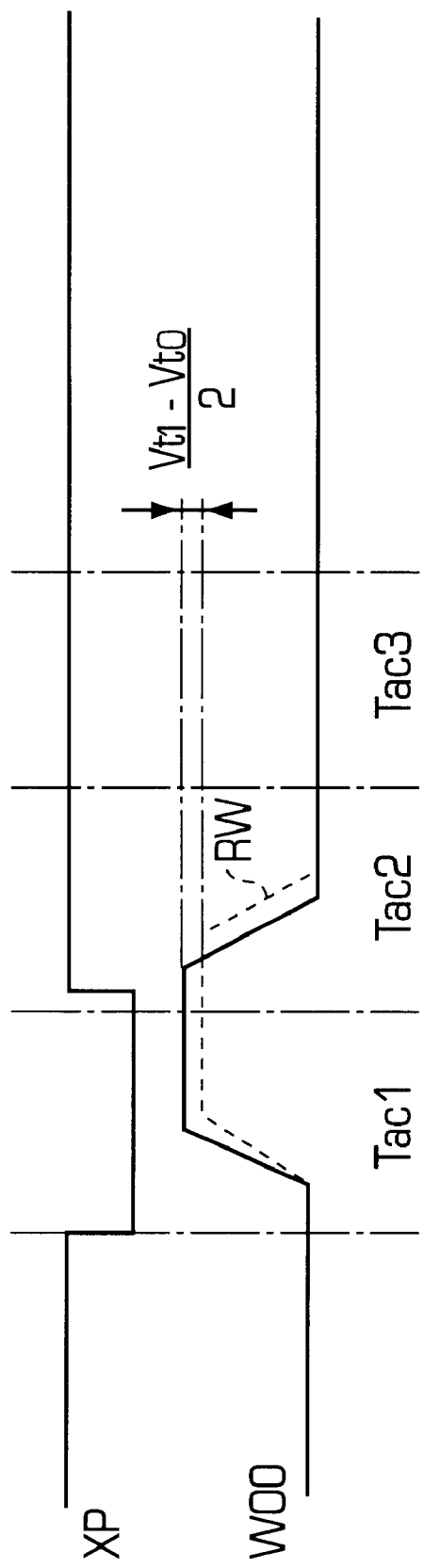
FIG. 2 is a reading timing diagram of the multiple value semiconductor memory device of the present invention.

Next, an operation of the present invention will be explained using FIG. 2. In the beginning, one threshold value level from threshed values having relationship of Vt0<Vt1<Vt2<Vt3 is written to the memory cell C1 (106). The difference between adjacent threshold values is almost the same. On the other hand, the reference cells RC1 (107), RC2 (108), RC3 (109) are written with different threshold value levels so that three states other than the threshold value Vt3 are written to the reference cells. Here, the threshold value of the reference cell RC1 (107) is set to Vt0, the threshold value of the reference cell RC2 (108) is set to Vt1, and the threshold value of the reference cell RC3 (109) is set to Vt2. The X decoder 101 makes the word line W00 (121) at HIGH level by an address signal on an address line XP (120) to select the memory cell C1 (106). On the other hand, the reference cells RC1 through RC3 (107 to 109) are supplied with a voltage having a level of ½ of the threshold values Vt1 minus Vt0, lower than the voltage supplied with the word line W00, via the output RW (122) of the level shift circuit 115.

An output of the memory cell C1 (106) is amplified with the sense amplifier 102 to generate a detection level SA to be supplied with the line 123. Furthermore, the output of the reference cells RC1 through RC3 (107 to 109) is amplified with each of the reference amplifiers 1 through 3 (103 to 105) to output the reference voltage signals RA0 through RA2 to be supplied with the lines 124 to 126. The detection level SA is input to all the three differential amplifiers 1 through 3 (110 to 112) with the reference voltage signals RA0 through RA2. When comparison and amplification result between the detection level SA and respective reference voltage signal RA0 through RA2 is determined by the three differential amplifiers 1 through 3 (110 to 112), the outputs S00 through S02 are transmitted to the encoder 113 through lines (127 to 129). The encoder 113 encodes a three state input from the difference amplifier circuits 1 through 3 (110 to 112) in accordance with Table 2 to convert the three state data into two-bit data. Then, an output circuit 114 receives the two-bit data and amplifies the received two bit data to output to the outside as the data D1 and D0 (130).

TABLE 2

| S00 | S01 | S22 | D1 | D0 |
|-----|-----|-----|----|----|
| 1   | 1   | 1   | 0  | 0  |
| 0   | 1   | 1   | 0  | 1  |
| 0   | 0   | 1   | 1  | 0  |
| 0   | 0   | 0   | 1  | 1  |

In this manner, data can be read during the period Tac 1 with the result that periods Tac2 and Tac3 are not required at all.

Figure 3:
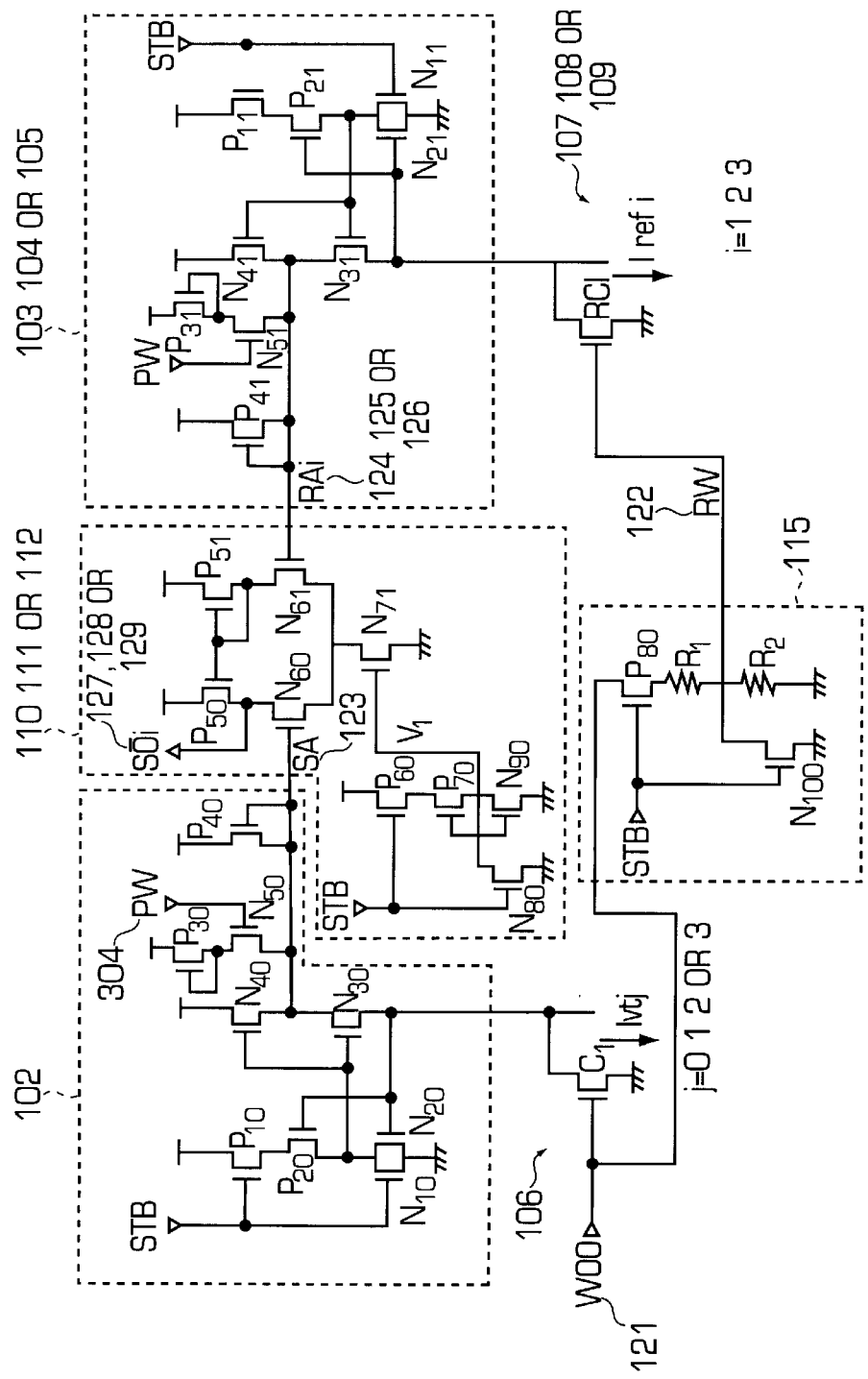
FIG. 3 is circuit diagram of the multiple value type semiconductor device according to an embodiment of the present invention.

A second embodiment of the present invention is explained using FIG. 3. FIG. 3 is a circuit diagram which includes a memory cell C1, a sense amplifier 102, a reference cell RCi (107, 108, 109), a reference amplifier RAi (103, 104, 105), a differential amplifier (110, 111, 112), and a level shift circuit (115) shown in FIG. 1. Here, in FIG. 1, relationship between one reference amplifier among three sense amplifiers and a differential amplifier is shown. That is, though three reference cells actually, three reference amplifiers and three differential amplifiers are used, FIG. 3 shows only one pair of them to omit the duplicative explanation. In any case, the structure of the other pairs is same.

The sense amplifier 102 comprises a feed back portion consisting of an NOR circuit including transistors P10, P20, N10, N20 and N30 (here, for example, P of P10 indicates a p conductive (channel) type and N of N10 indicates N conductive (channel) type) receiving a standby signal STB as gate inputs to P10 and N10, a charge up transistor N40 for a higher speed, a transistor N50 receiving a pulse input signal PW as gate input and connected to a load transistor P30 as charge up or equalizing circuits, and a load transistor P40. The sense amplifier 102 is connected to the memory cell C1 as an input thereof and the differential amplifier as an output thereof. The reference amplifier (103, 104 or 105) is the same structure as the sense amplifier 102 so that the explanation for the reference amplifier is omitted.

The differential amplifier (110, 111 or 112) comprises a regulated voltage circuit consisting of transistors P60, P70, N80 and N90 for generating a required regulated voltage level V1. The differential further includes a transistor N71 receiving an output of the regulated voltage circuit, transistors N60 and N61 for respectively inputting a sense amplifier detection level SA and a reference voltage signal RAi (i=1, 2 or 3) (124, 125, or 126) and transistors P50 and P51 constituting a current mirror pair. An output of the amplifier (110, 111 or 112) is outputted to the line (127, 128 or 126) as the signal SOi (i=1, 2 or 3).

The level shift circuit 115 (for example a voltage dividing circuit) comprises a transistor P80 having a source supplied with a word line level W00, a resistor element R1 connected to a drain of the transistor P80, a resistor element R2 connected between one end of the resistor R1 and the ground GND, and a transistor N100 having a drain with a connection point between the resistor elements R1 and R2 and a source connected to the GND.

Here, the relationship between an output of level shift circuit 115 and a voltage supplied to a word line W00 (121), and the relationship between current Ivt, j (j=0, 1, 2 or 3) which flows through the memory cell C1 and current Iref (i=1, 2 or 3) which flows through a reference cell RCi (i=1, 2 or 3) (107, 108, or 109) will be explained by referring to FIG. 4.

Figure 4:
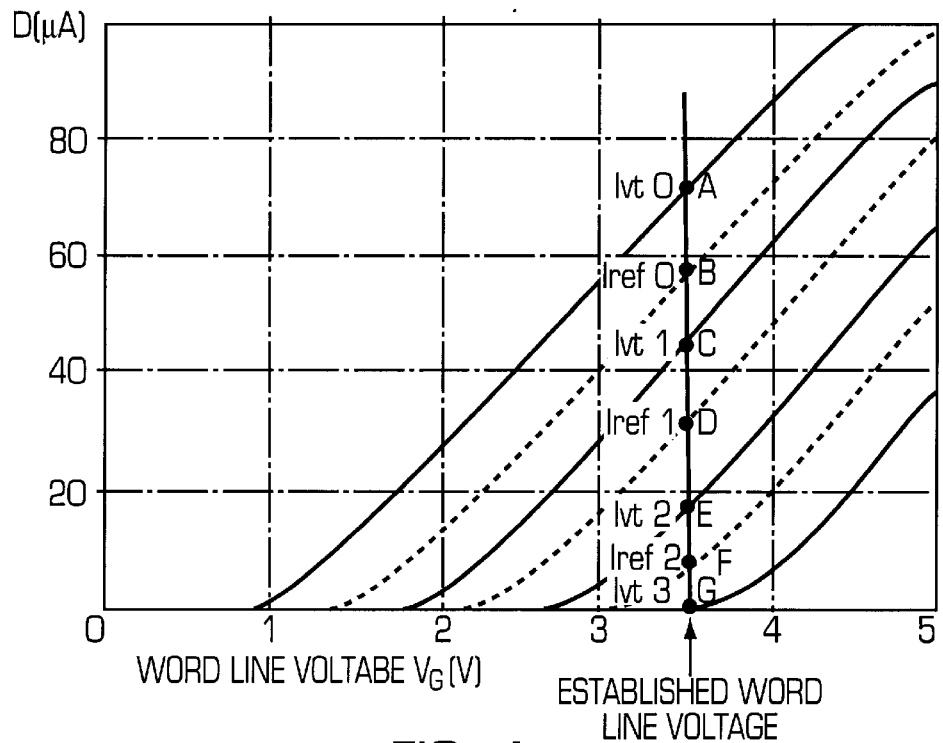
FIG. 4 is a view showing a relation between a gate voltage and a drain current of a memory cell and a reference cell.

FIG. 4 is a graph showing the relationship between a word line voltage Vg and drain current Id in the memory cell C1 and a reference cell RCi (i=1, 2 or 3). In the beginning, the resistors R1 and R2 are set so that a voltage drop amount of a reference word RW with respect to the word level W00 is set to half of a difference between voltages of adjacent threshold values Vt, that is, a difference between Vt0 and Vt1, a difference between Vt1 and Vt2, or a difference between Vt2 and Vt3. This is the same as an ostensible shift of the threshold value of the reference cell RCi (i=1, 2 or 3) (107, 108 or 109) so that even if the threshold value set in the reference cell RCi (i=1, 2 or 3) (107, 108 or 109) is the same as the threshold value set in the memory cell C1 (106), the current value Iref, i (i=1, 2 or 3) which flows through the reference cell RCi (i=1, 2 or 3) will be inevitably smaller than the current value Ivt, j (j=0, 1, 2 or 3) of the memory cell C1 (106).

Suppose that the threshold value Vt0 is written into the memory cell C1 (106) and a threshold value Vt0 level is written on the reference cell RC1. Drain voltages of the memory cell C1 (106) and the reference cell RC1 (107) at the time when no voltage is applied to the gate is the same because a potential is supplied to the drains of the cells C1 and RC1 from a bias circuit (not shown) having the same structure. Here, in the case where the level of the word line W00 is set to 3.5 V, the current which flows through the memory cell C1 becomes current value Ivt1 at the point C. Further, each current values of the reference cell RC2 and RC3 shown in FIG. 1 become Iref1 at the point D and Iref2 at the point F, respectively, because the reference cell RC2 and RC3 are set to the threshold value Vt1 and Vt2 respectively. Here, the relationship of Ivt0>Iref0>Ivt1 are set so that Iref0 is the intermediate value between Ivt0 and Ivt1. When the threshold value of the memory cell C1 is Vt0, Vt1, Vt2, and Vt3, the respective current value is Ivt0, Ivt1, Ivt2, and Ivt3 and each of current value of the reference cells RC1, RC2, and RC3 is Iref0 Iref1, and Iref2, there is the relationship of Ivt0>Iref0>Ivt1>Iref1>Ivt2>Iref2>Ivt3.

Next, the relationship between the sense amplifier level SAi and the reference level RAi (i=1, 2 or 3) (124 to 126) will be explained by referring to FIG. 5.

In the case where the threshold value Vt of the memory cell C1 is Vt1, the level of the SAi is the level of $V_{SA(C1=Vt1)}$ (507) with the voltage drop caused by the flow of current Ivt1 through the load transistor P40 (301). On the other hand, the output RA0 (124) of the reference amplifier RC1 (103) is the level of VRA0 (508) because the reference cell RC1 has the threshold value Vt0 and its gate is supplied with a voltage RW (122), lower than the word line voltage supplied to the word line W00 (122) by (½)×(Vt1−Vt0). In a similar manner, an output RA1 (125) of the reference amplifier 2 (104) is the level of VRA1 (506) and the output RA2 of the reference amplifier 3 (105) is the level of VRA2. Here, the relationship of $V_{RA0}<V_{SA(C1=Vt1)}<V_{RA1}<V_{RA2}$ is established.

Figure 5:
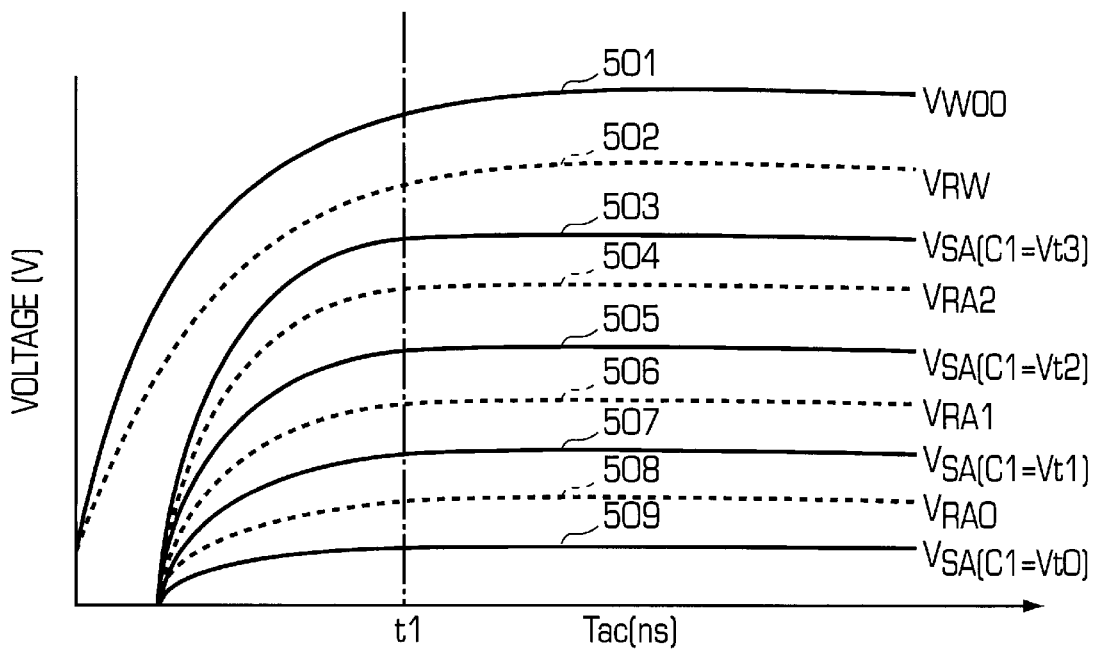
FIG. 5 is a comparison view comparing an output level of a sense amplifier and an output level of a reference amplifier in the multiple value type semiconductor memory device according to the present invention.
Figure 6:
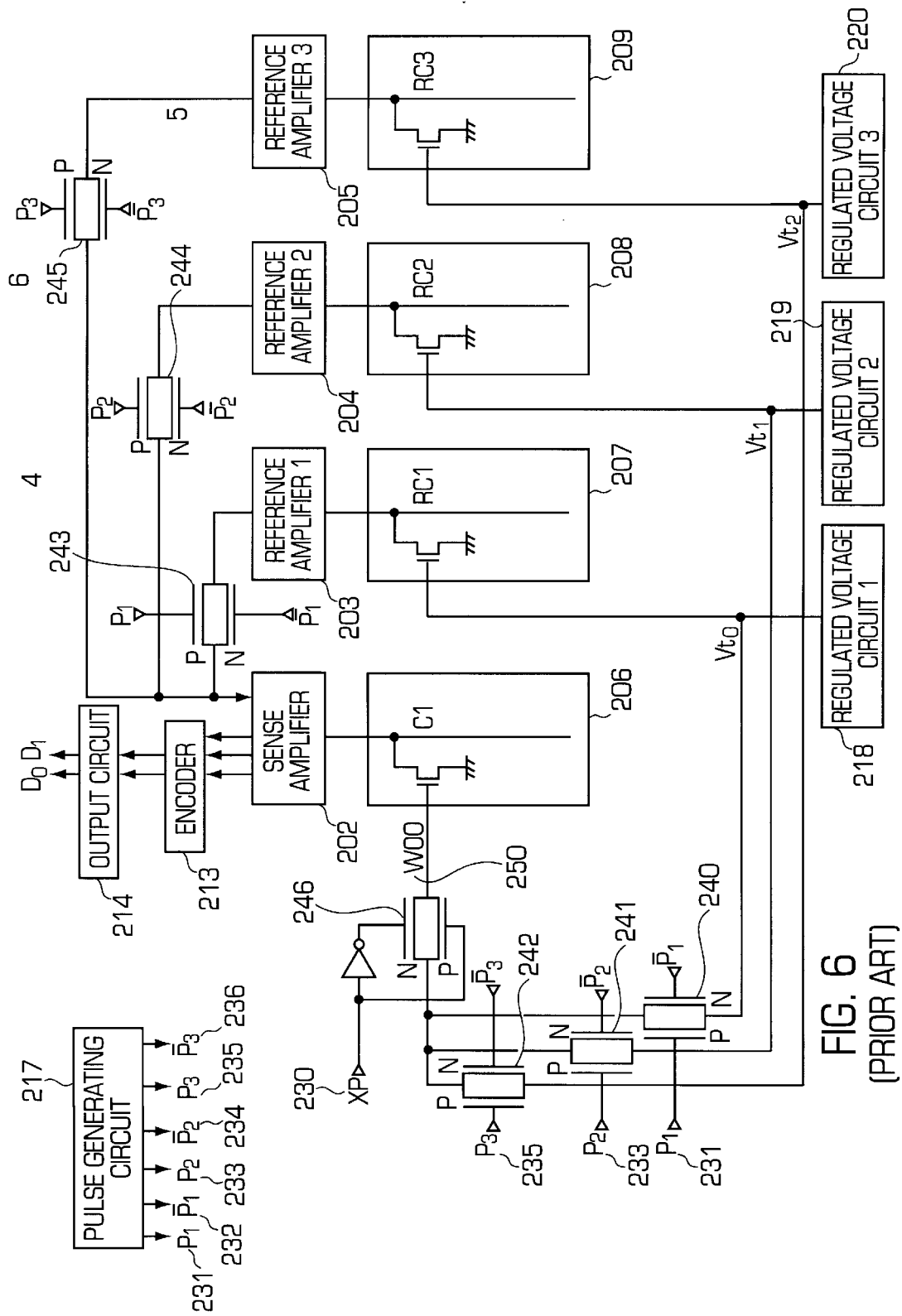
FIG. 6 is a block diagram of one example of a conventional multiple value type semiconductor memory device.
Figure 7:
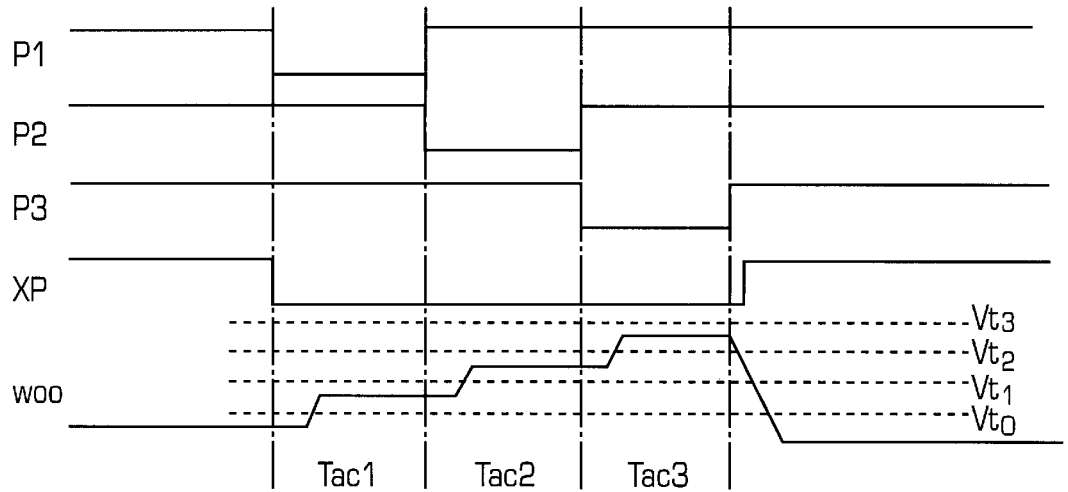
FIG. 7 is a reading timing diagram for the device shown in FIG. 6.
Figure 8:
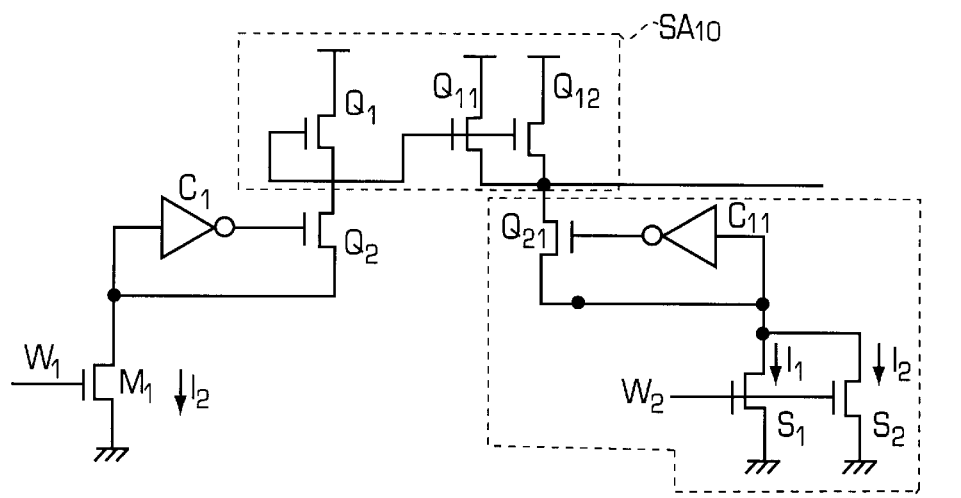
FIG. 8 is a circuit diagram of another conventional multiple value type semiconductor memory device.

In this embodiment, when the threshold value Vt of the memory cell C1 (106) is Vt1, as apparent from FIG. 5, since the relationship of $V_{RA0}<V_{SA(C1=Vt1)}$ is established, the output S00 (127) of the differential amplifier 1 (110) becomes Low (logic value 0). In a similar manner, since the relationship of $V_{RA1}>V_{SA(C1=Vt)}$ is established, the output S01 (128) of the differential amplifier 2 (111) becomes High (logic value 1). Since the relationship of $V_{RA2}>V_{SA(C1=Vt)}$ is established, the output S02 of the differential amplifier 3 (112) is also High (logic value 1).

The relationship between the outputs (D1 and D0) and the value of the outputs S00 through S02 in the case where the threshold value of the memory cell C1 (106) is Vt0 Vt1, Vt2 and Vt3 is shown in Table 3.

TABLE 3

| Vt of C1 | rel bet. Vsa and Vra | SO0 | SO1 | SO2 | D1 | D2 |
|---|---|---|---|---|---|---|
| Vt0 | $V_{SA} < V_{RA0}$ | 1 | 1 | 1 | 0 | 0 |
| Vt1 | $V_{RA0} < V_{SA} < V_{RA1}$ | 0 | 1 | 1 | 0 | 1 |
| Vt2 | $V_{RA1} < V_{SA} < V_{RA2}$ | 0 | 0 | 1 | 1 | 0 |
| Vt3 | $V_{RA2} < V_{SA}$ | 0 | 0 | 0 | 1 | 1 |

The outputs of S00 through S02 (127 to 129) is a inversion of the output of the prior art. However, when an inverter is attached to each of the outputs, the same output state is provided.

The level of the signal SA and the level of the signals RA0 through RA2 are raised at one time to become approximately the same level by heightening the pulse signal PW (204) to an H level applied to the transistors N50 (302) and N51 (303) provided for higher speed. Therefore, a speed improvement is carried out by performing a similar equalization. It has been explained that the level of the word line W00 (121) is supplied from the power source VCC. However, the level of the word line W00 (121) can be set to a level higher than the power source $V_{CC}$ by using a voltage raising circuit (not shown) In this case, as apparent from FIG. 4, current flowing through the memory cell C1 (106) and the reference cells RC1 through RC3 (107 to 109) will be further increased so that the speed can be further increased because the sense amplifier can determine which is larger earlier, and the power source $V_{CC}$ can be set to a lower voltage. Furthermore, in this embodiment, four value memory semiconductor device is explained, but the number of values to be memorized is not limited thereto. Generally, the present invention can be applied to an N value memory semiconductor memory device.

As explained above, according to the present invention, it is not required that the word line is raised to three stages to read data by using a binary search method. Since it is possible to read data only by raising the word line at one time, a speed can be obtained which is substantially the same as the speed of the conventional two value memory semiconductor device. Therefore, the read speed can be increased relative to the conventional four value memory semiconductor device. In other words, with the parasitic resistance and capacitance denoted by RC and the sense speed denoted by Ts, the data can be read in the following relationship: Tac=C×R+Ts because the word line is only raised at one time compared with the first related art. Therefore, the access time can be reduced to ⅓ level of the four value memory semiconductor memory device of a style for reading the conventional word line in three stages, and ½ level of the four value semiconductor memory device of binary search method. Furthermore, according to the present invention, as compared with a case in which the conventional word line is raised in three stages to read data, special circuits such as a regulated voltage circuit, a transfer gates, a delay circuit and the like are not required and the area can be decreased by 20%, thereby providing an advantage in that the chip area can be reduced.

As compared with the sense method described in No. SHO 62-140298, the reference cell can be formed only of one reference cell per one reference amplifier so that the occupation area of the reference cell can be set to ½ level. Furthermore, in the case of the comparison with a sense method described in No. SHO 62-140298, since the variation of the ON current in the distribution state is larger than the variation of the threshold value, there is possibility that the operation becomes unstable in the conventional method. On the other hand, according to the present invention, since the gate level of the reference cell is set lower than the word line level by half of a difference in the adjacent threshold value, to thereby set the threshold value can be set in an approximate manner at the middle point of the adjacent threshold values in consideration of the threshold value written in the memory cell. Consequently, a stable operation can be carried out even in consideration of variation of the threshold value.

It is apparent from the specification that the present invention is not limited to the above described embodiments but be modified and changed without departing from the scope and spirit of the invention. For example, the level shift circuit can have series transistors operating in the linear region rather the series resistors R1 and R2.

What is claimed is:

1. A semiconductor memory device comprising:
   a memory cell in which one threshold value is set out of n (n is an integer of 2 or more) kinds of threshold values;
   a word line connected to a gate of said memory cell;
   a decoder for selecting said word line;
   a sense amplifier for amplifying an output of said memory cell;
   n−1 reference cells in which n−1 kind of threshold values are respectively set;
   n−1 reference amplifiers for amplifying each outputs of said reference cells;
   n−1 differential amplifiers for receiving the respective outputs of said reference amplifiers and an output of said sense amplifier;
   an encoder for encoding an output of said n−1 differential amplifiers; and
   a level shift circuit connected to said word line and supplying a voltage to gates of all said reference cells, said voltage being lower than the voltage supplied with said word line by half of adjacent threshold voltage values.

2. The device as claimed in claim 1, wherein said sense amplifier comprises:
   a first transistor of a first conductive type having an one end connected to an input terminal and an other end connected to an output terminal;
   a second transistor of said first conductive type having an one end connected to a power source and an other end connected to said output terminal;
   an inverter having an input coupled to said input terminal and an output coupled to gates of said first and second transistors; and
   a load element coupled between said output terminal and said power source.

3. The device as claimed in claim 2, wherein said load element is a third transistor having a gate coupled to said output terminal, an one end connected to said power source, and an other end connected to said output terminal.

4. The device as claimed in claim 2, wherein said sense amplifier further comprises a charge up circuit for charging said output terminal.

5. The device as claimed in claim 4, wherein said charge up circuit includes: a third transistor of said first conductive type coupled between a first node and said output terminal; a fourth transistor of said second conductive type coupled between said first node and said power source.

6. The device as claimed in claim 2, wherein each of said reference amplifiers is the same structure with said sense amplifier.

7. The device as claimed in claim 1, wherein said level shift circuit comprises two resistive elements.

8. The device as claimed in claim 7, wherein said two resistance elements are resistors and said level shift circuit further comprises: said two resistor elements connected in series between a word voltage input terminal supplied with a voltage applied to said word line and a ground, a connecting point of said two resistor elements coupled to gates of said reference cells.

9. The device as claimed in claim 8, wherein said level shift circuit further comprises: a first transistor of a first conductive type coupled between said connecting point and said ground and having a gate supplied with a signal; and a second transistor of a second conductive type coupled between said connecting point and said word line and having a gate supplied with said signal.

10. The device as claimed in claim 9, wherein said differential amplifier comprises:
    a third transistor of said first conductive type coupled between a first node and a second node and having a gate supplied with an output of said sense amplifier;
    a fourth transistor of said first conductive type coupled between said first node and a third node and having a gate supplied with an output of said reference amplifier;
    a fifth transistor of said second conductive type coupled between said second node and a power source, having gate coupled to said third node;
    an sixth transistor of said second conductive type coupled between said third node and said power source, and having a gate coupled to said third node; and
    a seventh transistor of said first conductive type coupled between said first node and ground.

11. The device as claimed in claim 10, wherein said differential amplifier further comprises:
    an eighth transistor of said first conductive type coupled between said ground and a gate of said seventh transistor;
    a ninth transistor of said second conductive type coupled between said gate of said seventh transistor and a fourth node;
    a fourth transistor of said second conductive type coupled between said power source and said fourth node and having a gate supplied with a signal; and
    an eleventh transistor of said first conductive type coupled between gates of said eighth and ninth transistors and said ground, and having a gate supplied with said signal.

12. A semiconductor memory device comprising:
    a memory cell to be set to one threshold value from a plurality of threshold values, said memory cell having a gate electrode supplied with a word line voltage;
    at least one reference cell having a threshold value selected from said plurality of threshold values, said reference cell having a gate electrode; and
    a level shift circuit which receives said word line voltage and applies a shifted voltage, shifted from said word line voltage, to said gate electrode of said reference cell.

13. The device as claimed in claim 12, wherein said shifted voltage is a divided voltage which is divided based on a difference of one set of said plurality of threshold values.

14. The device as claimed in claim 13, wherein said shifted voltage is lower than said word line voltage by half of the difference between adjacent threshold voltage values of said plurality of threshold values.

15. The device as claimed in claim 12, further including a sense amplifier comprising:
 a first transistor of a first conductive type having an one end connected to an input terminal and an other end connected to an output terminal;
 a second transistor of said first conductive type having an one end connected to a power source and an other end connected to said output terminal;
 an inverter having an input coupled to said input terminal and an output coupled to gates of said first and second transistors; and
 a load element coupled between said output terminal and said power source.

16. The device as claimed in claim 15, wherein said load element is a third transistor having a gate coupled to said output terminal, an one end connected to said power source, and an other end connected to said output terminal.

17. The device as claimed in claim 15, wherein said sense amplifier further comprises a charge up circuit for charging said output terminal.

18. The device as claimed in claim 17, wherein said charge up circuit includes: a third transistor of said first conductive type coupled between a first node and said output terminal; a fourth transistor of said second conductive type coupled between said first node and said power source.

19. The device as claimed in claim 15, further including a plurality of reference amplifiers, each of which is the same structure with said sense amplifier.

20. A method of reading out data written in a memory cell set to a threshold value selected from a plurality of threshold values, comprising steps of:
 applying a word line voltage to said memory cell;
 applying a reference voltage based on said word line voltage, to a plurality of reference cells, said reference voltage being different from said word line voltage each of said reference cells having a threshold value different from each other selected from said plurality of threshold values; and
 comparing a current flowing through said memory cell when said memory cell is supplied with said word line voltage with a current flowing through each of said reference cells when said reference cells are supplied with said reference voltage.

21. The method as claimed in claim 20, wherein said reference voltage is shifted based on a difference of one set of said plurality of threshold values.

22. The method as claimed in claim 21, wherein said reference voltage is lower than said word line voltage by a half of the difference between adjacent threshold voltage values of said plurality of threshold values.

23. A semiconductor memory device comprising:
 a memory cell having a set threshold value selected from a plurality of threshold values which flows a first current when activated;
 at least one reference cell flowing a second current when said memory cell is activated;
 comparing means for comparing said first current with said second current; and
 reference cell current producing means for producing said second current such that a value of said second current is established between values of adjacent currents selected from currents each of which is a current flowing in said memory cell in case that said memory cell is set to one of said plurality of the respective threshold values supplied with a word line voltage, wherein said reference cell current producing means that includes a level shift circuit producing, to a gate of said reference cells, a voltage lower than said word line voltage set to half of adjacent threshold values from among said plurality of threshold values.

24. The device as claimed in claim 23, wherein said comparing means includes a first means for producing a first voltage corresponding to said first current, a second means for producing a second voltage corresponding to said second current, and a third means for comparing said first voltage with said second voltage.

25. A semiconductor memory device comprising:
 a memory cell set to a threshold value selected from a plurality of threshold values;
 a plurality of reference cells, each of reference cells set to a threshold value different from each other selected from said plurality of threshold values; and
 a level shift circuit which supplies a reference voltage to each of said reference cells, based on a difference between one set of said plurality of threshold values.

26. The device as claimed in claim 25, wherein said reference voltage is lower than a word line voltage applied to a gate of said memory cell by half of adjacent threshold values.

27. The device as claimed in claim 26, further comprising a first amplifier producing a first voltage corresponding to threshold value set to said memory cell.

28. The device as claimed in claim 27, wherein said first amplifier produces said first voltage based on a current flowing in said memory cell when said memory cell is supplied with said word line voltage.

29. The device as claimed in claim 28, further comprising a plurality of second amplifiers being corresponding to said reference cells, each second amplifier producing a plurality of second voltages corresponding to the respective threshold value set in each of said plurality of reference cells.

30. The device as claimed in claim 29, wherein each of said second amplifier produces said second voltage based on a current flowing in the respective reference cell when each reference cell is supplied with said reference voltage.

31. The device as claimed in claim 30, further comprising a plurality of third amplifiers, each third amplifier receiving said first voltage and the respective one of said second voltages.

32. The device as claimed in claim 31, wherein each of said first and second amplifiers includes a charge up circuit for charging output thereof.

* * * * *